United States Patent
Mrad et al.

(10) Patent No.: US 11,121,059 B2
(45) Date of Patent: Sep. 14, 2021

(54) POWER MODULE AND METHOD FOR MANUFACTURING POWER MODULE

(71) Applicant: MITSUBISHI ELECTRIC CORPORATION, Tokyo (JP)

(72) Inventors: Roberto Mrad, Rennes (FR); Stefan Mollov, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/604,024

(22) PCT Filed: May 1, 2018

(86) PCT No.: PCT/JP2018/018023
§ 371 (c)(1),
(2) Date: Oct. 9, 2019

(87) PCT Pub. No.: WO2018/221149
PCT Pub. Date: Dec. 6, 2018

(65) Prior Publication Data
US 2020/0161212 A1    May 21, 2020

(30) Foreign Application Priority Data
May 29, 2017 (EP) .................................... 17173262

(51) Int. Cl.
*H01L 23/427* (2006.01)
*H01L 23/473* (2006.01)
(Continued)

(52) U.S. Cl.
CPC .......... *H01L 23/427* (2013.01); *H01L 23/473* (2013.01); *H05K 1/0272* (2013.01);
(Continued)

(58) Field of Classification Search
CPC ................. H01L 23/427; H01L 23/473; H01L 2924/00014; H01L 2924/00012;
(Continued)

(56) References Cited

U.S. PATENT DOCUMENTS 10,392,244 B2 * 8/2019 Hung ..................... B81B 7/0038
2004/0229391 A1 * 11/2004 Ohya ......................... F21K 9/00
438/26
(Continued)

FOREIGN PATENT DOCUMENTS

DE    102008040906 A1 * 2/2010 ............. H01L 24/19
WO    WO 01/63667 A1    8/2001

OTHER PUBLICATIONS

International Search Report, issued in PCT/JP2018/018023, PCT/ISA/210, dated Jul. 25, 2018.
(Continued)

*Primary Examiner* — Mandeep S Buttar
(74) *Attorney, Agent, or Firm* — Birch, Stewart, Kolasch & Birch, LLP

(57) ABSTRACT

The present invention concerns a power module composed of a first and second parts (100a, 100b), the first part being composed of conductor layers and insulation layers, characterized in that a first conductor layer is on bottom of the first part, the second part is composed of at least one second conductor layer, the first and/or the second conductor layers comprise cavities that form pipes (300a, 300b) when the first and second conductor layers are in contact, and in that the first and the second conductor layers are bonded together by a metal plating (400a, 400g) of the walls of the pipes.

11 Claims, 4 Drawing Sheets

(51) Int. Cl.
*H05K 1/02* (2006.01)
*H05K 1/18* (2006.01)
*H05K 7/20* (2006.01)

(52) U.S. Cl.
CPC ......... *H05K 1/185* (2013.01); *H05K 7/20936* (2013.01); *H05K 2201/064* (2013.01); *H05K 2203/0723* (2013.01)

(58) Field of Classification Search
CPC ........... H01L 23/49822; H01L 25/0657; H01L 23/28; H01L 24/03; H05K 1/0272; H05K 1/185; H05K 7/20936; H05K 2201/064; H05K 2203/0723; H05K 3/4644; H05K 3/4697; H05K 2201/0959; H05K 2201/096; H05K 3/384; H05K 2203/072; H05K 3/429; H05K 3/0094; H05K 2201/09536; H05K 3/42; H05K 2203/061; H05K 2203/073

USPC ..... 361/700, 679.46, 679.53, 710, 718, 761; 257/714, E23.062, E23.098; 165/80.4, 165/104.33
See application file for complete search history.

(56) References Cited

U.S. PATENT DOCUMENTS

2009/0296349 A1* 12/2009 Suzuki ................... H05K 1/141
361/705
2018/0213641 A1* 7/2018 Hosoda ................ H05K 1/0366

OTHER PUBLICATIONS

Written Opinion of the International Searching Authority, issued in PCT/JP2018/018023, PCT/ISA/237, dated Jul. 25, 2018.

* cited by examiner

POWER MODULE AND METHOD FOR MANUFACTURING POWER MODULE

TECHNICAL FIELD

The present invention relates generally to a power module and a method for manufacturing the power module.

BACKGROUND ART

Electric power modules may require to make electrical and thermal connection between two metal surfaces like for example a bonding between a Direct bonded copper substrate and a cold-plate or a connection between two printed circuit boards (PCB). Classically, the connection is made through soldering, sintering or conductive adhesive. Electric power modules may further comprise power dies embedded within the printed circuit boards.

Thermally and electrically attaching a first and a second material surfaces requires a third material that can be pure material or a mix between different material types. Such method creates two interfaces, a first interface is between the first and third materials, the second interface is between the second and third materials. These interfaces are usually weak points that can cause failures in the power module. This is due to the different material properties such as thermo-mechanical behaviour, atom migrations or others.

The present invention aims to allow the manufacturing of the power module composed of two parts that are bonded wherein the bonding does not generate weak points that can cause failure of the power module.

SUMMARY OF INVENTION

To that end, the present invention concerns a power module composed of a first and second parts, the first part being composed of conductor layers and insulation layers, characterized in that a first conductor layer is on bottom of the first part, the second part is composed of at least one second conductor layer, the first and/or the second conductor layers comprise cavities that form pipes when the first and second conductor layers are in contact, and in that the first and the second conductor layers are bonded together by a metal plating of walls of the pipes.

Thus, a connection is made between both parts which can serve as mechanical, electrical or thermal connection.

According to a particular feature, the pipes are filled with a material in order to improve the mechanical, electrical and/or thermal properties of the bond.

According to a particular feature, the pipes are filled with two-phase materials.

Thus, the heat is transported outside of the power module and the equivalent termal capacity is increased.

According to a particular feature, the material of the conductor layers is identical to the metal plating material.

Thus, the final assembly is a single medium with no interfaces which reduces the risk of cracks and delamination that leads to a power module failure.

According to a particular feature, the material of the conductor layers and the metal plating material are copper.

Thus, this technology can be included in a widely used and mature power electronic manufacturing processes such as DCB (Direct Copper Bonding) or PCB manufacturing.

According to a particular feature, the walls of the pipes are further metal plated by a surface passivation material.

According to a particular feature, the surface passivation material is nickel or gold.

According to a particular feature, the second part is composed of conductor layers and insulation layers and semiconductor devices and/or passive components are embedded within the first and/or second parts.

Thus the final assembly is electrically and thermally optimized power electronic system.

The present invention concerns also a method for manufacturing a power module composed of a first and second parts, the first part being composed of conductor layers and insulation layers, a first conductor layer is on bottom of the first part, the second part is composed of at least one second conductor layer, characterized in that the method comprises the steps of:

forming on the first and/or the second conductor layers cavities, superposing the first and the second conductor layers, the cavities forming pipes when the first and second conductor layers are in contact, performing a metal plating of the walls of the pipes formed by the first and the second conductor layers in order to bond the first and second parts.

Thus, an electrical and a thermal connection is formed between both layers.

According to a particular feature, the pipes are filled with a material in order to improve the mechanical, electrical and/or thermal properties of the bond.

According to a particular feature, the pipes are filled with two-phase materials.

Thus, the heat spreading is enhanced or the heat is transported outside the module and more importantly, the thermal capacity is greatly enhanced.

According to a particular feature, the material of the conductor layers is identical to the metal plating material.

Thus, the final assembly is a single medium with no interfaces which reduces the risk of cracks and delamination that leads to a power module failure.

According to a particular feature, the method further comprises the step of plating the walls of the pipes with a surface passivation material.

Thus, the cooling circuit will remain without deposits for longer time and its maintenance is reduced or negated as the surface passivation is resistant to the cooling fluid.

The characteristics of the invention will emerge more clearly from a reading of the following description of example embodiments, the said description being produced with reference to the accompanying drawings.

DESCRIPTION OF EMBODIMENTS

Figure 1:
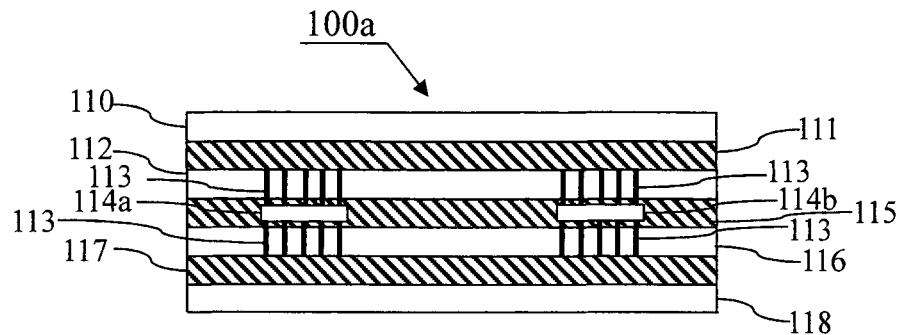
FIG. 1 represents a first part of a power module to be processed in order to create pipes between the first part and a second part of the power module according to the present invention.

FIG. 1 represents a first part of a power power module to be processed in order to create pipes between the first part and a second part of the power module according to the present invention.

The first part 100a of the power module is for example a printed circuit board made of conductor layers 110, 112, 116 and 118, like for example copper layers and insulation layers 111, 115 and 117 like for example FR4.

The printed circuit board may have semiconductor or passive devices 114a and 114b embedded in the structure.

In the example of FIG. 1, the first part is a printed circuit board made of four conductor layers 110, 112, 116 and 118 which are made of copper and three insulation layers 111, 115 and 117 which are made of FR4. The structure has two semiconductor devices 114a and 114b embedded in the first part and connected by laser drilling and copper plating 113.

Figure 2:
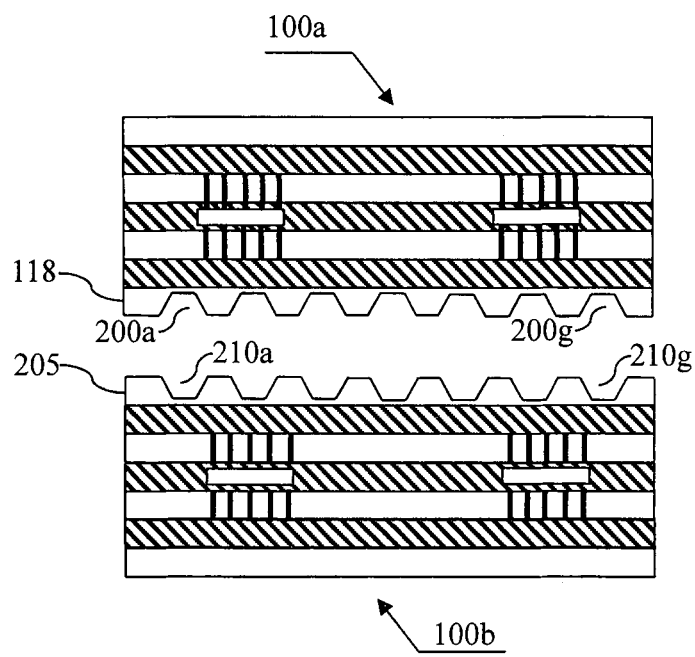
FIG. 2 represents the first and second parts of the power module according to the present invention.

FIG. 2 represents the first and second parts of the power module according to the present invention.

In the example of FIG. 2, the second part 100b of the power module is similar to the first part. It has to be noted here that the second part may be different from the first part, the second part may be composed of a single conductor layer.

In the example of FIG. 2, the second part 100b is a printed circuit board made of four conductor layers which are made of copper and three insulation layers which are made of FR4. The structure has two semiconductor devices embedded in the first part and connected by laser drilling and copper plating.

The first and second parts 100a and 100b of the power module, more precisely the conductor layer 118 of the first part 100a and the conductor layer 205 of the second part are processed in order to form cavities 200a to 200g on the surface of the conductor layer 118 and cavities 210a to 210g on the surface of the conductor layer 205 when the first and second parts are in contact.

The process is for example a mechanical, a chemical or other etching technique that form cavities.

In the example of FIG. 2, the cavities are created on both surfaces of the conductor layers 118 and 205. In a variant, cavities are created on only one surface of the conductor layer 118 or 205.

Figure 3:
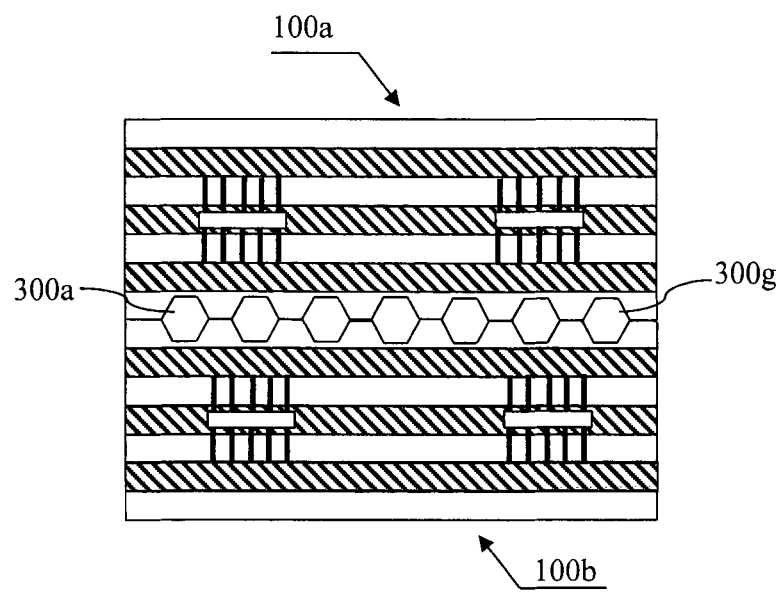
FIG. 3 represents the first and second parts of the power module that are assembled in order to form pipes according to the present invention.

FIG. 3 represents the first and second parts of the power module that are assembled in order to form pipes according to the present invention.

Both parts are pressed together in order to make close pipes 300a and 300g. The pressing can be made through direct contact between the two surfaces of the conductor layers 118 and 205 or using an additional adhesive layer.

In a variant of realization, a FR4 sheet is used to attach and align both parts together. Note that a similar geometry to the pipes geometry has to be cut, for example by laser cutting, in the FR4 sheet in order to ensure an electrical contact between the two parts.

Figure 4:
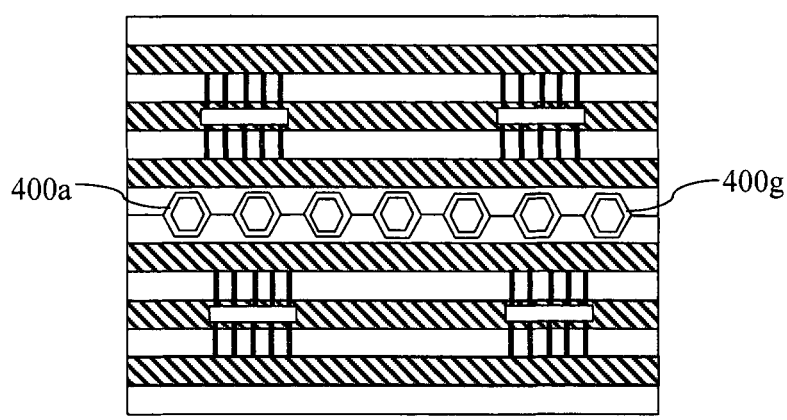
FIG. 4 represents the first and second parts of the power module that are bonded together thanks to a metal plating of the walls of the pipes.

FIG. 4 represents the first and second parts of the power module that are bonded together thanks to a metal plating of the walls of the pipes.

The plating can be made though a single or multiple plating cycles.

Once the two parts 100a and 100b are pressed together they are placed in an electro-less plating bath where the plating fluid flow inside the pipes and a copper layer is made on the entire inner surface of the pipes.

Afterwards, the power module may be placed in an electroplating bath in order to increase the metal plating 400a and 400g thickness.

Once the required copper plating thickness is attained, the two parts are now bonded and an electrical and thermal connection is made between the two bonded surfaces.

Figure 5:
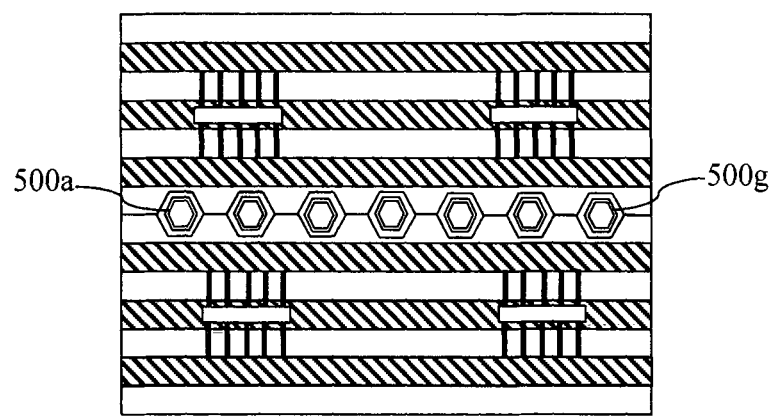
FIG. 5 represents the first and second parts of the power module that are bonded together and wherein a second passivation metal plating of the walls of the pipes is performed according to the present invention.

FIG. 5 represents the first and second parts of the power module that are bonded together and wherein a second passivation metal plating of the walls of the pipes is performed according to the present invention.

In order to avoid a copper oxidation inside the pipes, a dedicated surface finishing may be applied.

Therefore, the assembly is now placed in multiple chemical plating baths in order to make a plating of a thin layer of metal, such as nickel, to ensure a good adhesion a gold plating afterwards.

The unclosed pipes can be used in order to conduct cooling fluid in order to cool down the structure.

Figure 6:
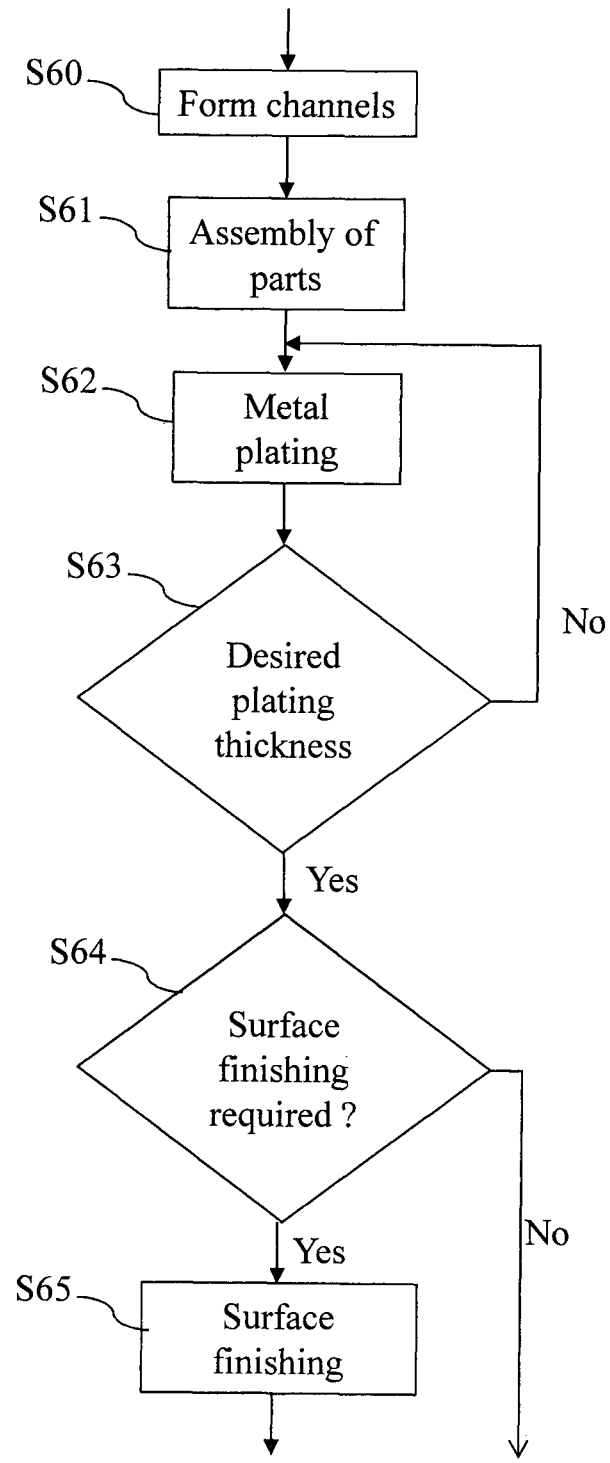
FIG. 6 represents an algorithm for manufacturing a power module according to the present invention.

FIG. 6 represents an alogrithm for manufacturing a power module according to the present invention.

At step S60, cavities are created into the surface areas to be bonded in order to make a path for a plating fluid. The cavities can be made by any subtractive process like mechanical, chemical, electrical or other. Alternatively, suitable protrusions can be formed by selective additive processes, for example masked electrodeposition. The machining or etching can be made on a single surface of the first or the second parts of the power module or both surfaces.

At step S61, the first and second parts are assembled. The parts are pressed together and will create closed pipes with a single or multiple entrance for the plating fluid and a single or multiple exit for the fluid.

At step S62, once the first and second parts are pressed together, a plating fluid is fed into the pipes or the assembly is placed in a plating bath where a metal deposition is made inside the pipes, with for example forced fluid circulation. The deposited metal creates a mechanical, electrical and thermal joint between the surfaces.

The metal plating process can be controlled to vary the degree with which the pipes are closed. The deposition method can be any fluid-based metal deposition such as electroplating or electro-less. A combination between multiple plating methods and multiple metal plating types can also be made in order to improve the bonding electrical, mechanical, chemical or thermal properties.

In some cases, where the plated metal has low adhesion to the bonded areas, a dedicated seed-finishing such as nickel, zinc, titan or other can be applied to the areas before the plating process in order to improve the bond between both surfaces.

The surfaces can be pressed together directly with no intermediate material, or an adhesive layer such organic or inorganic materials is disposed between the surfaces for a better alignment between the two structures. These adhesive materials can have or not metal filling in order to adapt the bonding properties.

At step S63, the thickness of the metal plating is controled.

For example, the thickness has to be comprised between few micrometers up to several hundreds of micrometers.

If the thickness of the metal plating is comprised between few micrometers up to several hundreds of micrometers, the process moves to step S64, otherwise the step S62 is reiterated.

At step S64, a surface passivation is decided or not.

If no surface passivation has to be executed the method ends. Otherwise, at step S65, a dedicated surface passivation, such as gold or other, is performed inside the unfilled pipes in order to avoid the oxidation or corrosion of the pipe inner surfaces, for example by plating a thin layer of metal, such as nickel, to ensure a good adhesion and a gold plating afterwards.

According to a particular mode of realization, the pipes are filled with a material such as organic adhesive filled with metal or ceramic particles or other in order to improve the mechanical, electrical and/or thermal properties of the bond.

According to a particular mode of realization, the pipes are filled with two-phase materials in order to create heat pipes or increase the thermal capacity inside the unclosed pipes. Such heat pipes transport can be used to spread the heat or transport it outside the power module.

Naturally, many modifications can be made to the embodiments of the invention described above without departing from the scope of the present invention.

The invention claimed is:

1. A power module composed of a first and second parts, the first part being composed of conductor layers and insulation layers, wherein a first conductor layer is on bottom of the first part, the second part is composed of at least one second conductor layer, the first and/or the second conductor layers comprise cavities that form pipes running parallel to the first and second conductor layers, and walls of each of the pipes formed by the corresponding cavities of the first and second layers are collectively covered by a common integral metal plating in such manner that the integral metal plating bonds the first and the second conductor layer forming a water-tight conduit.

2. The power module according to claim 1, wherein the pipes are filled with a material in order to improve the mechanical, electrical and/or thermal properties of the bond.

3. The power module according to claim 1, wherein the pipes are filled with two-phase materials.

4. The power module according to claim 1, wherein the conductor layers material is identical to the metal plating material.

5. The power module according to claim 4, wherein the conductor layers material and the metal plating material are copper.

6. The power module according to claim 5, wherein the walls of the pipes are further metal plated by a surface passivation material.

7. The power module according to claim 6, wherein the surface passivation material is finished by nickel and gold.

8. The power module according to claim 1, wherein the second part is composed of conductor layers and insulation layers and power dies and/or passive components are embedded within the first and/or the second parts.

9. A method for manufacturing a power module composed of a first and second parts, the first part being composed of conductor layers and insulation layers, a first conductor layer is on bottom of the first part, the second part is composed of at least one second conductor layer, wherein the method comprises the steps of:

forming on the first and/or the second conductor layers cavities, superposing the first and the second conductor layers, the cavities forming pipes when the first and second conductor layers are in contact, performing a metal plating of walls of the pipes formed by the first and the second conductor layers in order to bond the first and second parts.

10. The method according to claim 9, wherein the pipes are filled with a material in order to improve the mechanical, electrical and/or thermal properties of the bond.

11. The method according to claim 9, wherein the method further comprises the step of plating the walls of the pipes by a surface passivation material.

\* \* \* \* \*